(12) United States Patent
Xia et al.

(10) Patent No.: US 7,447,027 B2
(45) Date of Patent: Nov. 4, 2008

(54) HYBRID HEAT DISSIPATION DEVICE

(75) Inventors: Wan-Lin Xia, Shenzhen (CN); Tao Li, Shenzhen (CN); Yong Zhong, Shenzhen (CN)

(73) Assignees: Fu Zhun Precision Industry (Shen Zhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 361 days.

(21) Appl. No.: 11/306,194

(22) Filed: Dec. 19, 2005

(65) Prior Publication Data

US 2007/0139886 A1    Jun. 21, 2007

(51) Int. Cl.
*H05K 7/20* (2006.01)

(52) U.S. Cl. .................... 361/697; 361/695; 361/700

(58) Field of Classification Search ............ 361/700, 361/695, 697
See application file for complete search history.

(56) References Cited

U.S. PATENT DOCUMENTS

| | | | | |
|---|---|---|---|---|
| 4,291,754 A * | 9/1981 | Morse et al. | ............... | 165/165 |
| 5,959,837 A * | 9/1999 | Yu | ............... | 361/697 |
| 6,189,601 B1 * | 2/2001 | Goodman et al. | ............... | 165/80.3 |
| 6,394,175 B1 * | 5/2002 | Chen et al. | ............... | 165/80.3 |
| 6,542,364 B2 | 4/2003 | Lai et al. | | |
| 6,625,021 B1 * | 9/2003 | Lofland et al. | ............... | 361/697 |
| 6,651,734 B1 * | 11/2003 | Liu | ............... | 165/80.3 |
| 6,745,824 B2 * | 6/2004 | Lee et al. | ............... | 165/104.14 |
| 6,779,595 B1 * | 8/2004 | Chiang | ............... | 165/104.33 |
| 6,809,926 B2 | 10/2004 | Liu | | |
| 6,880,346 B1 * | 4/2005 | Tseng et al. | ............... | 62/3.7 |
| 6,909,608 B2 * | 6/2005 | Fan | ............... | 361/700 |
| 6,920,045 B2 * | 7/2005 | Huang et al. | ............... | 361/700 |
| 6,940,717 B2 * | 9/2005 | Shih-Tsung | ............... | 361/695 |
| 6,958,915 B2 * | 10/2005 | Wang et al. | ............... | 361/709 |
| 6,959,755 B2 * | 11/2005 | Chen | ............... | 165/80.3 |
| 6,964,295 B1 * | 11/2005 | Yu et al. | ............... | 165/104.33 |
| 6,967,845 B2 * | 11/2005 | Chiang et al. | ............... | 361/709 |
| 7,011,144 B2 * | 3/2006 | Zeighami et al. | ............... | 165/104.21 |
| 7,073,568 B2 * | 7/2006 | Chen et al. | ............... | 165/104.33 |
| 7,110,259 B2 * | 9/2006 | Lee et al. | ............... | 361/700 |
| 7,167,364 B2 * | 1/2007 | Lopatinsky et al. | ............... | 361/697 |
| 7,174,951 B1 * | 2/2007 | Lin | ............... | 165/104.33 |
| 7,245,494 B2 * | 7/2007 | Cheng | ............... | 361/700 |
| 7,269,012 B2 * | 9/2007 | Lee et al. | ............... | 361/700 |
| 7,289,322 B2 * | 10/2007 | Chen et al. | ............... | 361/695 |
| 7,296,617 B2 * | 11/2007 | Lee et al. | ............... | 165/80.3 |

(Continued)

FOREIGN PATENT DOCUMENTS

CN          2653578 Y      11/2004

(Continued)

*Primary Examiner*—Anatoly Vortman
(74) *Attorney, Agent, or Firm*—Winston Hsu

(57) ABSTRACT

A heat dissipation device includes a plurality of first, second and third fins arranged side by side and a fan. The fins define a plurality of parallel channels therein respectively for air flowing therethrough. The fan and the channels of the first fins corporately define an enhanced airflow path which is isolated from the channels of the second and third fins so that the fan entirely impels an airflow generated by the fan to pass through the channels of the first fins. The first fins are located corresponding to a portion of a bottom surface of a base for contacting with a heat-generating electronic component.

16 Claims, 3 Drawing Sheets

U.S. PATENT DOCUMENTS

| | | | |
|---|---|---|---|
| 2002/0043360 A1* | 4/2002 | Lee | 165/80.3 |
| 2002/0080582 A1* | 6/2002 | Chang | 361/700 |
| 2003/0011990 A1* | 1/2003 | Lai et al. | 361/697 |
| 2003/0218849 A1* | 11/2003 | Mochizuki et al. | 361/103 |
| 2003/0230398 A1* | 12/2003 | Lee et al. | 165/104.21 |
| 2004/0066628 A1* | 4/2004 | Liu | 361/704 |
| 2004/0120115 A1* | 6/2004 | Huang et al. | 361/695 |
| 2004/0165350 A1* | 8/2004 | Fan | 361/700 |
| 2004/0226697 A1* | 11/2004 | Liu | 165/104.33 |
| 2005/0061479 A1* | 3/2005 | Lee et al. | 165/80.3 |
| 2005/0067144 A1* | 3/2005 | Chou | 165/80.3 |
| 2005/0087329 A1* | 4/2005 | Zhang et al. | 165/104.33 |
| 2005/0099774 A1* | 5/2005 | Song | 361/700 |
| 2005/0103477 A1* | 5/2005 | Kim et al. | 165/104.33 |
| 2005/0141198 A1* | 6/2005 | Lee et al. | 361/700 |
| 2005/0141202 A1* | 6/2005 | Lee et al. | 361/704 |
| 2005/0183849 A1* | 8/2005 | Ko et al. | 165/104.33 |

FOREIGN PATENT DOCUMENTS

WO     WO 2004055656 A1 *   7/2004

* cited by examiner

HYBRID HEAT DISSIPATION DEVICE

FIELD OF THE INVENTION

The present invention relates generally to a heat dissipation device, and more particularly to a hybrid heat dissipation device which comprises a heat sink, heat pipes and a fan.

DESCRIPTION OF RELATED ART

Computer electronic devices such as central processing units (CPUs) frequently generate large amounts of heat, which can destabilize operation and cause damage to the electronic devices. For meeting the requirement of dissipating heat from a CPU having a high temperature, a heat dissipation device comprising a heat sink as well as at least one heat pipe and a fan is popularly used.

In a typical heat dissipation device, the heat sink is formed by extrusion and comprises a base for receiving heat from the CPU and a plurality of fins extending from the base to dissipate the heat to ambient air. The heat pipe comprises an evaporating portion engaged with the base and a condensing portion engaged with the fins, to transfer the heat from the base to the fins remote from the base. The fan is mounted on a side of the heat sink via a fan holder to impel air to flow into the heat sink for exchanging heat with the heat sink. In the heat dissipation device, the fan is mounted at an outside of the heat sink. The air from the fan primarily strikes outer fins of the heat sink instead of center fins which have a higher temperature than the outer fins. As a result, the air passing through the heat sink cannot sufficiently take away the heat accumulated mostly on the center fins. Additionally, the heat dissipation device occupies a large space within a computer casing having a limited space.

SUMMARY OF INVENTION

A heat dissipation device in accordance with a preferred embodiment of the present invention comprises a plurality of first, second and third fins arranged side by side on a base and a fan. The fins define a plurality of parallel channels therein respectively for air flowing therethrough. The fan and the channels of the first fins corporately define an enhanced airflow path which is isolated from the channels of the second and third fins so that the fan entirely impels an airflow generated by the fan to pass through the channels of the first fins. The first, second and third fins are arranged with each other to have a U-shaped configuration as viewed from a top of the heat dissipation device. The first fins are located between the second and third fins. The fan is mounted on a top surface of the base and located between the second and third fins and in front of the first fins. The first fins are located at a position of the top surface of the base corresponding to that of a portion of a bottom surface of the base for contacting with a heat-generating electronic component.

Other advantages and novel features will become more apparent from the following detailed description of preferred embodiments when taken in conjunction with the accompanying drawings, in which:

DETAILED DESCRIPTION

Figure 1:
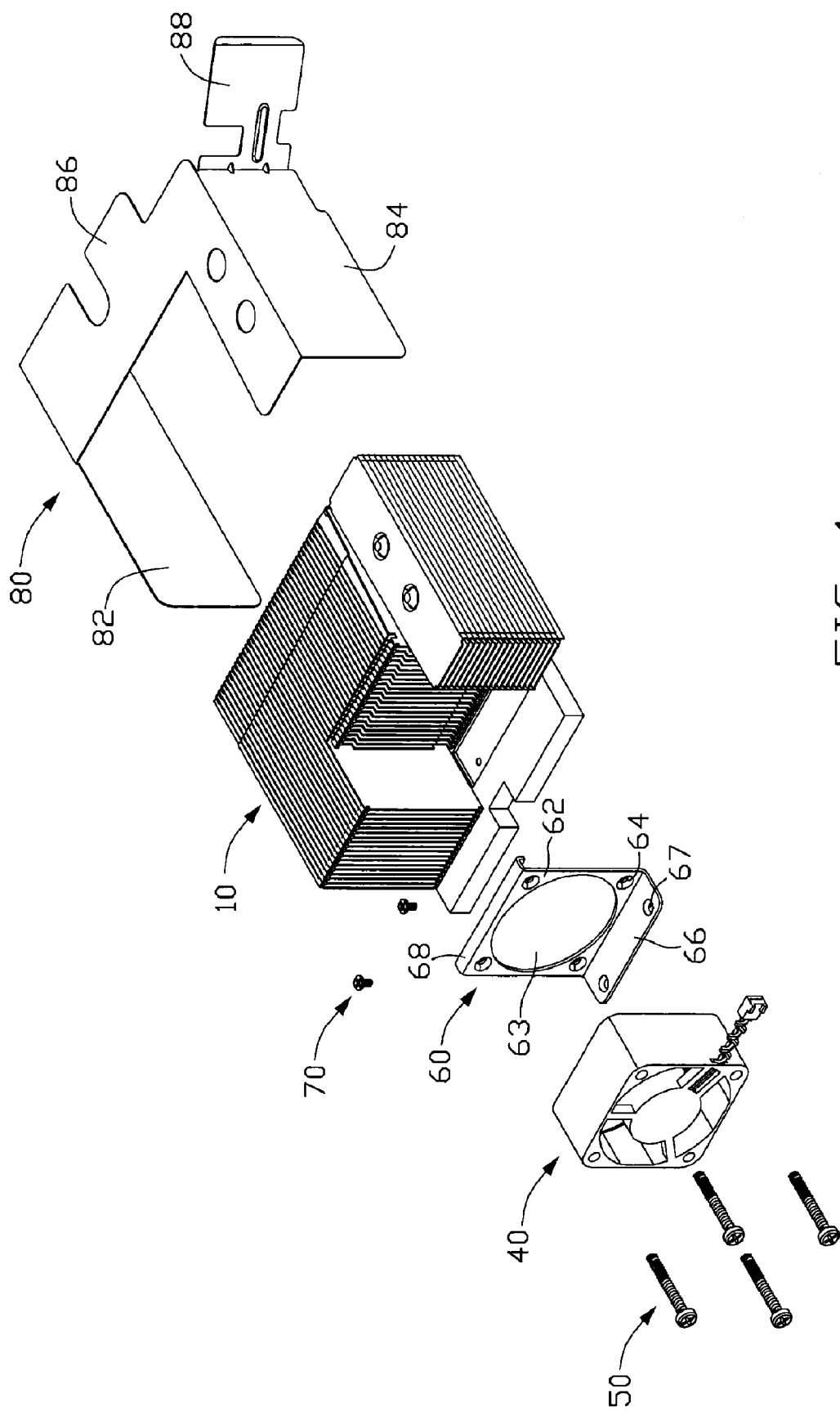
FIG. 1 is an exploded, isometric view of a heat dissipation device in accordance with a preferred embodiment of the present invention.
Figure 2:
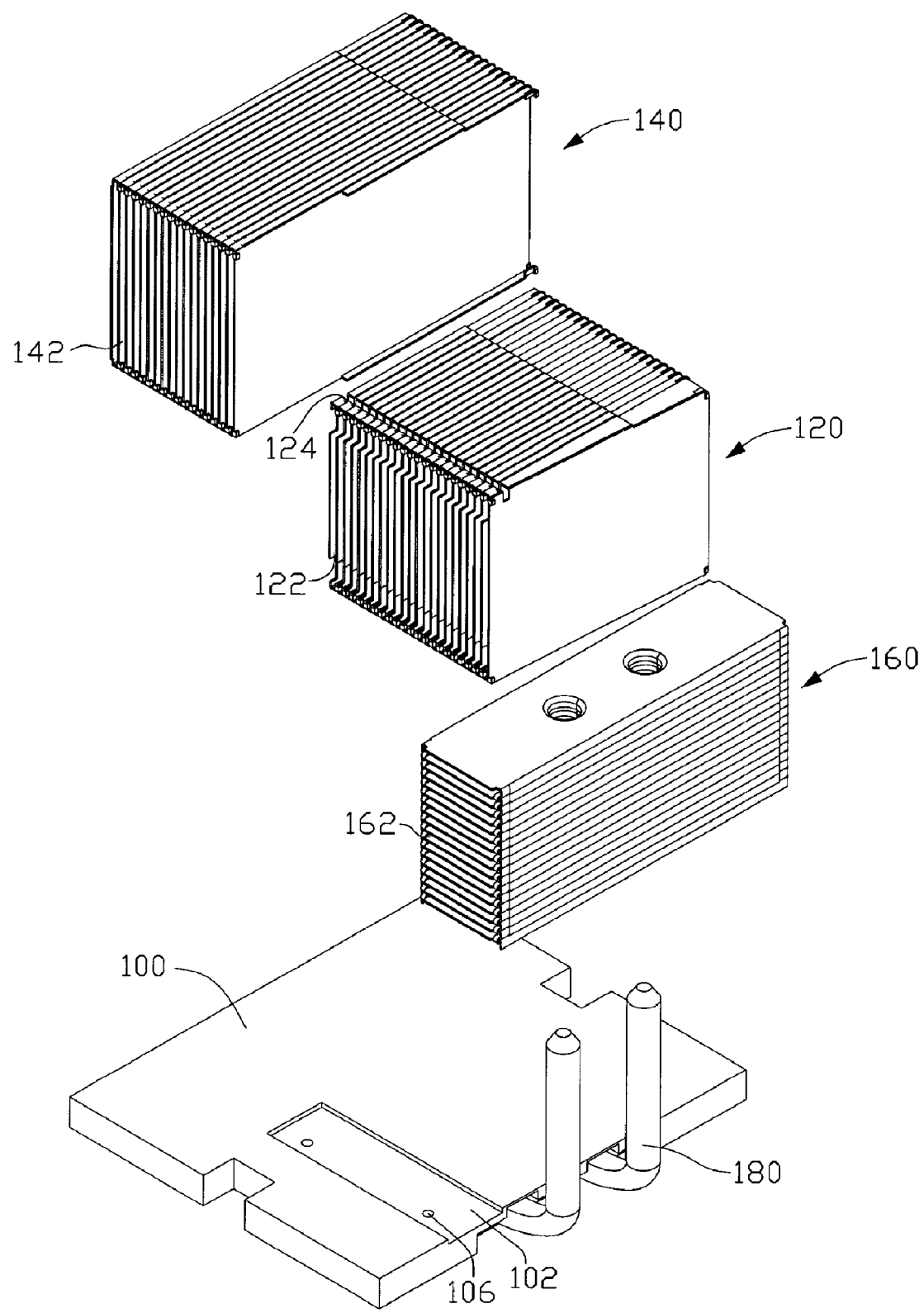
FIG. 2 is an exploded view of a heat sink assembly of the heat dissipation device of FIG. 1.
Figure 3:
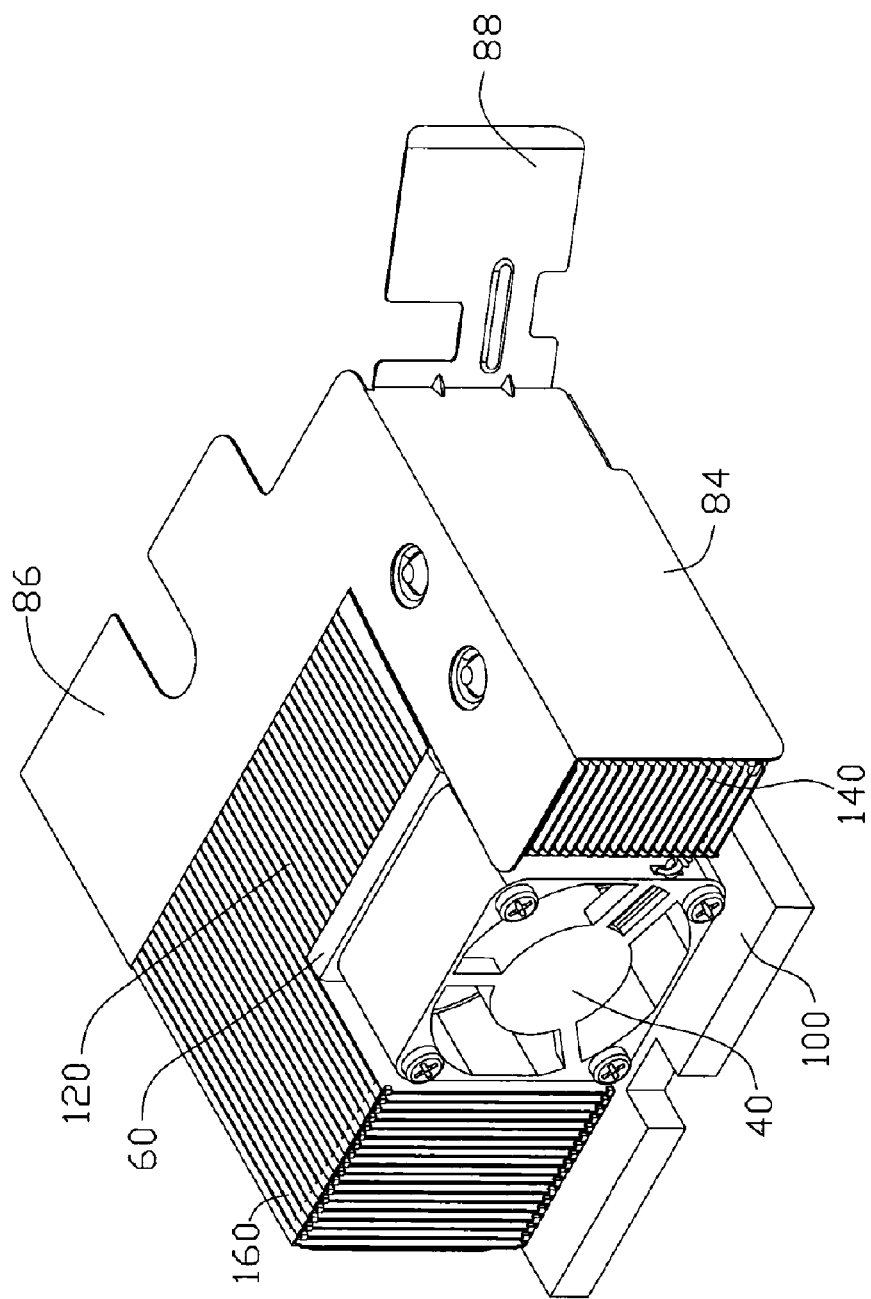
FIG. 3 is an assembled view of FIG. 1.

Referring to FIGS. 1-3, a heat dissipation device in accordance with a preferred embodiment of the invention comprises a heat sink assembly 10, a fan 40, a fan holder 60 for mounting the fan 40 to the heat sink assembly 10, and an airflow orienting plate 80.

Referring to FIG. 2, the heat sink assembly 10 comprises a base 100 functioning as a heat receiving portion, a plurality of first fins 120, a plurality of second fins 140, a plurality of third fins 160 and two heat pipes 180. The fins 120, 140, 160 function as heat dissipation portions. The preferred embodiment provides two heat pipes 180. However, the number of the heat pipes 180 is a matter of design choice.

The base 100 defines a concave portion 102 in a top surface thereof. The concave portion 102 is located adjacent to a front end portion of the base 100, and extends through a right side thereof. A pair of separate positioning holes 106 is defined in the concave portion 102. The first and second fins 120, 140 are perpendicularly mounted to the base 100 by a conventional means, such as soldering. The concave portion 102 is exposed between the first and second fins 120, 140. The third fins 160 are located on the base 100 and supported by the heat pipes 180. The first fins 120 are interposed between the second and third fins 140, 160. The fins 120, 140, 160 form a generally U-shaped configuration after they are arranged on the base 100, as viewed from a top of the heat dissipation device. The first fins 120 are mounted on the top surface of the base 100 at a position corresponding to that of a portion of a bottom surface of the base 100 for contacting with a heat-generating electronic component, such as a central processing unit (CPU). The first fins 120 define a plurality of parallel channels 122 therethrough and an engaging groove 124 extending across a front side of a top of the first fins 120 along a direction perpendicular to the channels 122. The second fins 140 define a plurality of channels 142 parallel to the channels 122 of the first fins 120. The third fins 160 define a plurality of horizontal channels 162. The channels 122 of the first fins 120 are isolated from the channels 142, 162 of the second and third fins 140, 160. The channels 122, 142, 162 of the fins 120, 140, 160 provide airflow passages for air to pass through the fins 120, 140, 160. In the preferred embodiment, the first, second, third fins 120, 140, 160 are arranged side by side in a first direction (i.e., lateral direction). The channels 122, 142, 162 extend in a second direction (i.e. front-to-rear direction) perpendicular to the first direction. A space (not labeled), communicating with the channels 122 of the first fins 120 and isolated from the channels 142, 162 of the second and third fins 140, 160, is defined between the second and third fins 140, 160 and in front of the first fins 120. The heat pipes 180 each are L-shaped and each have an evaporating portion (not labeled) engaged with the base 100 and a condensing portion (not labeled) perpendicularly extending from the evaporating portion and inserted through the third fins 160 to support the third fins 160 and transfer heat from the base 100 to the third fins 160 for being dissipated to ambient atmosphere.

The fan holder 60 is located at a front side of the first fins 120. The fan holder 60 comprises a main body 62, a positioning flange 66 perpendicularly extending forwardly from a bottom edge of the main body 62 for being received in the concave portion 102 of the base, and an engaging flange 68 perpendicularly extending rearwards from a top edge of the main body 62 for engaging in the engaging groove 124 of the first fins 120. The main body 62 defines a central round opening 63 therein communicating with the channels 122 of the first fins 120 and four threaded holes 64 in four corners thereof. The positioning flange 66 defines two through holes 67 aligned with the positioning holes 106 of the base 10, respectively. Two fastening members 70, i.e., screws, are used to extend through the through holes 106 and threadedly engage in the positioning holes 106 to position the fan holder 60 on the concave portion 102 of the base 10.

The fan 40 is received within the space and secured to the fan holder 60 by extending four screws 50 through the fan 40 to threadedly engage in the threaded holes 64 of the fan holder 60. The fan 40 and the first fins 120 are both disposed between the second and third fins 140, 160. The fan 40 is directly oriented toward the channels 122 of the fins 120 and impels air to flow into the channels 122 of the fins 120 via the opening 63 of the fan holder 60. Since the channels 122 of the fins 120 are isolated from the channels 142, 162 of the fins 140, 160 and the fan 40 is received within the space between the fins 140, 160, an airflow generated by the fan 40 is entirely impelled by the fan 40 to flow through the channels 122 to exchange heat with the first fins 120 which are located occupying a center of the heat sink assembly 10. The center of the heat sink assembly 10 usually is the hottest portion of the heat sink assembly 10. In the preferred embodiment of the present invention, the communicated fan 40 and first fins 120 defines an enforced airflow path in the second direction which is isolated from the channels 142, 162 of the second and third fins 140, 160; thus, the second fins 140 and the third fins 160 dissipate the heat thereon by natural convection, and the first fins 120 between the second fins 140 and the third fins 160 dissipate the heat thereon by an enforced convection. Therefore, the first fins 120 can more quickly dissipate the heat thereon than the second and third fins 140, 160.

The orienting plate 80 comprises a pair of sidewalls 82, 84 disposed outside and extending rearwards beyond a rear end of the second and third fins 140, 160, a blocking wing 86 interconnecting rear end portions of a top of the sidewalls 82, 84 and a guiding wing 88 extending laterally outwardly from a rear end of the sidewall 82 for guiding air to flow toward a predetermined location. The blocking wing 86 covers a top of a rear end of the fins 120, 140, 160 and extends rearwards beyond the fins 120, 140, 160 to ensure the airflow generated by the fan 40 to fully flow through the first fins 120 before it leaves the first fins 120 so that the airflow can have a sufficient heat exchange with the first fins 120 to take heat away therefrom. The blocking wing 86 and the guiding wing 88 commonly control the direction of the airflow after exiting the channels 122 of the heat sink assembly.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a heat sink assembly comprising a base, a plurality of parallel first fins and second fins mounted onto the base, the first fins defining a plurality of channels therebetween;
   a heat pipe having a first portion and a second portion perpendicularly to the first portion, the first portion of the heat pipe engaged with the base;
   a plurality of third fins engaging with the second portion of the heat pipe;
   a fan holder positioned to the base and located at a side of the first fins; and
   a fan mounted onto the fan holder and beside the first fins;
   wherein the fan and the first fins are disposed between the second and third fins and wherein the fan is oriented toward the channels of the first fins to entirely impel an airflow generated by the fan to pass through the channels of the first fins;
   wherein the base comprises a concave portion between first and second fins;
   wherein the fan holder comprises a main body defining a central opening communicating with the channels of the first fins; and
   wherein a positioning flange extends from a bottom edge of the main body and is positioned to the concave portion of the base.

2. The heat dissipation device as claimed in claim 1, wherein the first fins defines an engaging groove extending across the first fins, and wherein an engaging flange extends from a top edge of the main body and is engaged in the engaging groove.

3. The heat dissipation device as claimed in claim 1, wherein threaded holes are defined in corners of the main body for securing the fan to the fan holder via screws extending through the fan and engaging in the threaded holes.

4. The heat dissipation device as claimed in claim 1, further comprising an airflow orienting plate for controlling airflow direction after exiting the heat sink assembly.

5. The heat dissipation device as claimed in claim 1, wherein the second and third fins define a plurality of channels, respectively, isolated from the channels of the first fins.

6. A heat dissipation device comprising:
   an array of first, second and third heat dissipation portions arranged side by side, and defining a plurality of parallel channels therein respectively for air flowing therethrough; and
   a fan embedded in the array of the heat dissipation portions, the fan and the channels of one of the first, second and third heat dissipation portions corporately defining an enhanced airflow path which is isolated from the channels of the other two of the first, second and third heat dissipation portions so that the fan entirely impels an airflow generated by the fan to pass through the channels of said one of the first, second and third heat dissipation portions;
   wherein the fan and the first heat dissipation portion are disposed between the second and third heat dissipation portions and the fan impels the airflow generated by the fan entirely through the channels of the first heat dissipation portion.

7. The heat dissipation device as claimed in claim 6, further comprising a heat receiving portion.

8. The heat dissipation device as claimed in claim 7, wherein the first and second heat dissipation portions are attached to the heat receiving portion.

9. The heat dissipation device as claimed in claim 7, further comprising a fan holder to position the fan to the heat receiving portion.

10. The heat dissipation device as claimed in claim 7, further comprising a heat pipe having an evaporating portion engaged with the heat receiving portion and a condensing portion inserted through the third heat dissipation portion.

11. The heat dissipation device as claimed in claim 6, wherein a space communicating with the channels of the first heat dissipation portion and isolated from the channels of the second and third heat dissipation portions, is defined between the second and third heat dissipation portions and beside the first heat dissipation portion, and wherein the fan is received within the space.

12. A heat dissipation device comprising:
- a base having a bottom surface having a portion adapted for contacting with a heat generating electronic component and a top surface;
- first fins, second fins and third fins mounted on the top surface of the base, the three fins generally forming a U-shaped configuration wherein the first fins are located between the second and third fins and at a position corresponding to the portion of the bottom surface of the base adapted for contacting with the heat-generating electronic component; and
- a fan mounted on the top surface of the base and located between the second and third fins and in front of the first fins;
- wherein the fan is perpendicular to the top surface of the base, and the third fins are parallel to the top surface of the base and located at lateral sides of the fan and the first fins, respectively.

13. The heat dissipation device of claim 12 further comprising a heat pipe thermally connecting the base and the third fins.

14. The heat dissipation device of claim 12 further comprising an air flow orienting plate mounted on the first, second and third fins, the orienting plate having a blocking wing covering a top of a rear end portion of the first fins.

15. The heat dissipation device of claim 12, wherein the first, second and third fins define a plurality of passages therein, respectively, the passages of the first fins are isolated from the passages of the second and third fins.

16. The heat dissipation device of claim 12, wherein the fan is mounted on a fan holder fastened to the top surface of the base, the fan holder having an engaging flange extending rearwards from a top of the fan holder, the engaging flange engaging a top of the first fins.

* * * * *